US009455374B2

United States Patent
Park et al.

(10) Patent No.: US 9,455,374 B2
(45) Date of Patent: Sep. 27, 2016

(54) INTEGRATED MULTI-COLOR LIGHT EMITTING DEVICE MADE WITH HYBRID CRYSTAL STRUCTURE

(71) Applicant: The United States of America as represented by the Administrator of the National Aeronautics and Space Administration, Washington, DC (US)

(72) Inventors: Yeonjoon Park, Yorktown, VA (US); Sang Hyouk Choi, Poquoson, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/279,614

(22) Filed: May 16, 2014

(65) Prior Publication Data

US 2014/0339580 A1    Nov. 20, 2014

Related U.S. Application Data

(60) Provisional application No. 61/824,017, filed on May 16, 2013.

(51) Int. Cl.
| | |
|---|---|
| H01L 33/08 | (2010.01) |
| H01L 33/00 | (2010.01) |
| H01L 27/15 | (2006.01) |
| H01L 33/16 | (2010.01) |

(52) U.S. Cl.
CPC .............. H01L 33/08 (2013.01); H01L 27/15 (2013.01); H01L 33/007 (2013.01); H01L 33/16 (2013.01)

(58) Field of Classification Search
None
See application file for complete search history.

(56) References Cited

U.S. PATENT DOCUMENTS

| 7,045,375 B1 | 5/2006 | Wu et al. |
| 7,514,726 B2 | 4/2009 | Park et al. |
| 7,767,479 B2 | 8/2010 | El-Ghoroury et al. |
| 7,769,135 B2 | 8/2010 | Park et al. |
| 7,851,242 B2 | 12/2010 | Bour et al. |
| 7,906,358 B2 | 3/2011 | Park et al. |
| 8,044,294 B2 | 10/2011 | Park et al. |
| 8,058,802 B2 | 11/2011 | Li et al. |

(Continued)

OTHER PUBLICATIONS

Jonathan R. Skuza, et al., "Feasibility Study of Cargo Airship Transportation Systems Powered by New Green Energy Technologies," NASA/TM-2014-218241, Apr. 2014.

*Primary Examiner* — Khaja Ahmad
(74) *Attorney, Agent, or Firm* — Jennifer L. Riley

(57) ABSTRACT

An integrated hybrid crystal Light Emitting Diode ("LED") display device that may emit red, green, and blue colors on a single wafer. The various embodiments may provide double-sided hetero crystal growth with hexagonal wurtzite III-Nitride compound semiconductor on one side of (0001) c-plane sapphire media and cubic zinc-blended III-V or II-VI compound semiconductor on the opposite side of c-plane sapphire media. The c-plane sapphire media may be a bulk single crystalline c-plane sapphire wafer, a thin free standing c-plane sapphire layer, or crack-and-bonded c-plane sapphire layer on any substrate. The bandgap energies and lattice constants of the compound semiconductor alloys may be changed by mixing different amounts of ingredients of the same group into the compound semiconductor. The bandgap energy and lattice constant may be engineered by changing the alloy composition within the cubic group IV, group III-V, and group II-VI semiconductors and within the hexagonal III-Nitrides.

11 Claims, 7 Drawing Sheets

(56) References Cited

U.S. PATENT DOCUMENTS

| | | |
|---|---|---|
| 8,226,767 B2 | 7/2012 | Park et al. |
| 8,257,491 B2 | 9/2012 | Park et al. |
| 2007/0069195 A1 | 3/2007 | Park et al. |
| 2009/0103680 A1 | 4/2009 | Park et al. |
| 2009/0206368 A1 | 8/2009 | Park et al. |
| 2009/0220047 A1* | 9/2009 | Park et al. ............... 378/70 |
| 2010/0075175 A1* | 3/2010 | Poblenz et al. ........... 428/697 |
| 2011/0014739 A1 | 1/2011 | Kondakov |
| 2013/0106284 A1* | 5/2013 | Kim ............... H01L 25/167 315/71 |
| 2013/0200334 A1* | 8/2013 | Zhang et al. ............ 257/13 |
| 2013/0286634 A1* | 10/2013 | Lo et al. ............... 362/97.1 |

\* cited by examiner (b) Bandgap Engineering with Wurtzite and Hexagonal Structures (a) Bandgap Engineering with Diamond (IV) and Zinc-Blende Structures (III-V and II-VI), Cubic

INTEGRATED MULTI-COLOR LIGHT EMITTING DEVICE MADE WITH HYBRID CRYSTAL STRUCTURE

CROSS REFERENCE TO RELATED APPLICATIONS

This application claims the benefit of priority to U.S. Provisional Application No. 61/824,017 filed on May 16, 2013 entitled "INTEGRATED MULTI-COLOR LIGHT EMITTING DEVICE MADE WITH HYBRID CRYSTAL STRUCTURE", the entire contents of which are hereby incorporated by reference in their entirety.

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. §202) and may be manufactured and used by or for the Government for governmental purposes without the payment of any royalties thereon or therefore. In accordance with 35 U.S.C. §202, the contractor elected not to retain title.

BACKGROUND OF THE INVENTION

1. Field of the Invention

The present invention relates to a hybrid crystal light emitting diode ("LED") display device and more particularly to a hybrid crystal LED display device that may emit red, green, and blue colors on a single wafer.

2. Description of the Related Art

Today's Light Emitting Diodes ("LEDs") are built with many compound semiconductors with type-I direct bandgap energies of two different crystal structures. While red, orange, yellow, yellowish green, and green LEDs are commonly made with III-V semiconductor alloys of aluminum gallium indium phosphide (AlGaInP) and aluminum gallium indium arsenide (AlGaInAs) with cubic zinc blende crystal structures, the higher energy colors such as green, blue, purple, and ultra-violet ("UV") LEDs are made with III-nitride compound semiconductors of AlGaInN alloys with hexagonal wurtzite crystal structures. Because the atomic crystal structures are different for red LED and green/blue LEDs, the integration and fabrication of these red and green/blue semiconductor LEDs as individual red ("R"), green ("G"), blue ("B") pixels on one wafer has been extremely difficult.

BRIEF SUMMARY OF THE INVENTION

The various embodiments provide an integrated multi-color light emitting device (e.g., a light emitting diode ("LED")) with a hybrid crystal structure and methods for making the same. Various embodiments may provide an integrated hybrid crystal Light Emitting Diode ("LED") display device that may emit red, green, and blue colors on a single wafer. The various embodiments may provide double-sided hetero crystal growth with hexagonal wurtzite III-Nitride compound semiconductor on one side of (0001) c-plane sapphire media and cubic zinc-blended III-V or II-VI compound semiconductor on the opposite side of c-plane sapphire media. In various embodiments the c-plane sapphire media may be a bulk single crystalline c-plane sapphire wafer, a thin free standing c-plane sapphire layer, or crack-and-bonded c-plane sapphire layer on any substrate. In various embodiments the bandgap energies and lattice constants of the compound semiconductor alloys may be changed by mixing different amounts of ingredients of the same group into the compound semiconductor. In various embodiments the bandgap energy and lattice constant may be engineered by changing the alloy composition within the cubic group IV, group III-V, and group II-VI semiconductors and within the hexagonal III-Nitrides.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION OF THE INVENTION

Figure 1:
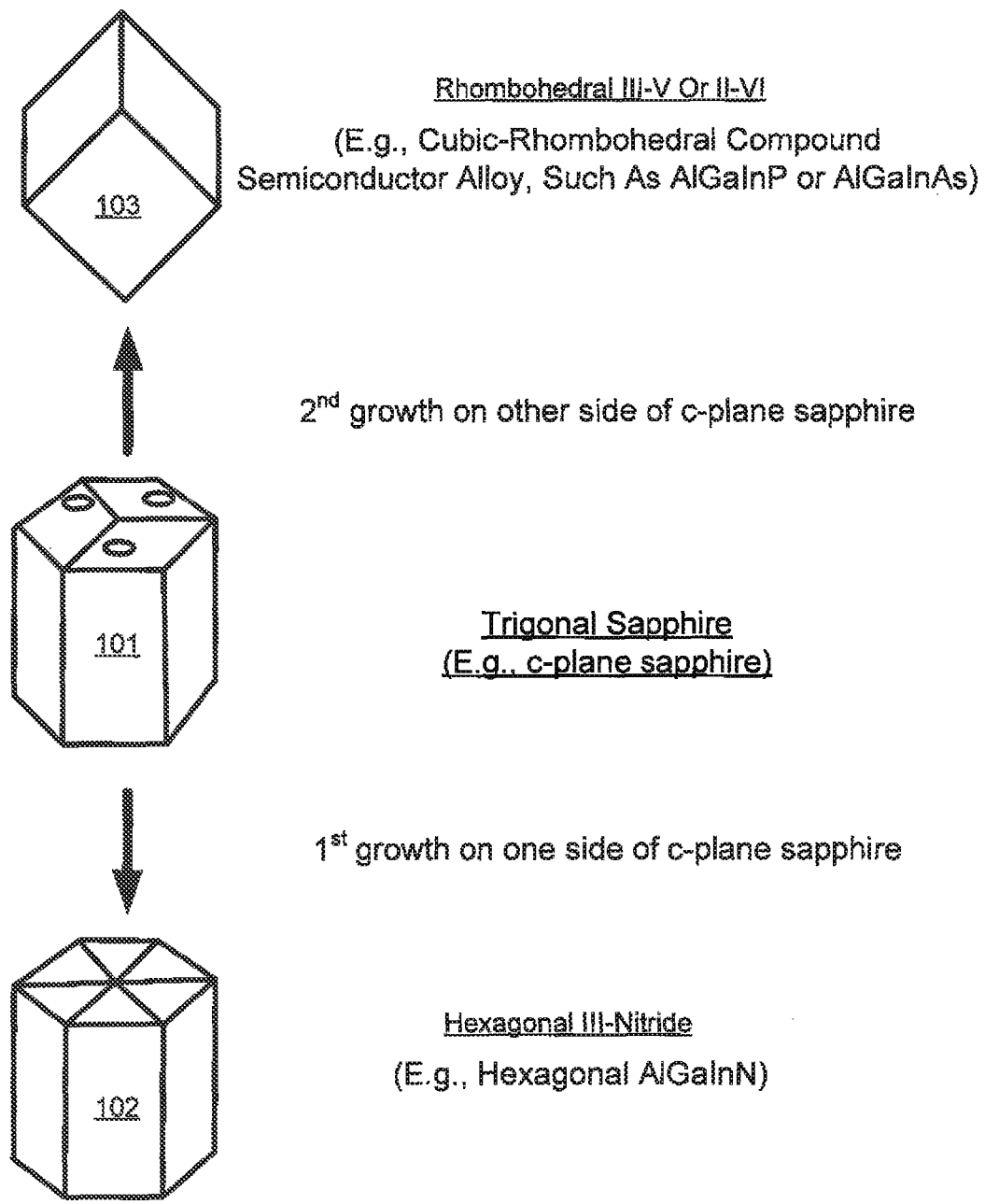
FIG. 1 illustrates a double sided hetero crystal structure with the hexagonal wurtzite AlGaInN structure on one side of the c-plane sapphire and the cubic zinc blende III-V or II-VI compound semiconductor, such as AlGaInP or AlGaInAs on the other side of the c-plane sapphire.

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The word "exemplary" is used herein to mean "serving as an example, instance, or illustration." Any implementation described herein as "exemplary" is not necessarily to be construed as preferred or advantageous over other implementations.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Recently, a noble rhombohedral super hetero epitaxy technology has been developed that can grow the (111) oriented single crystalline cubic semiconductors, such as silicon germanium (SiGe), aluminum gallium indium phosphide (AlGaInP), and aluminum gallium indium arsenide (AlGaInAs), on a (0001) c-plane of trigonal substrate, such as a sapphire ($Al_2O_3$) wafer. Examples of relevant epitaxial technologies are described in U.S. Pat. No. 7,341,883 issued Mar. 11, 2008 entitled "SILICON GERMANIUM SEMI-CONDUCTIVE ALLOY AND METHOD OF FABRICATING SAME", U.S. Pat. No. 7,514,726 issued Apr. 7, 2009 entitled "GRADED INDEX SILICON GERANIUM ON LATTICE MATCHED SILICON GERANIUM SEMICONDUCTOR ALLOY", U.S. Pat. No. 7,558,371 issued Jul. 7, 2009 entitled "METHOD OF GENERATING X-RAY DIFFRACTION DATA FOR INTEGRAL DETECTION OF TWIN DEFECTS IN SUPER-HETERO-EPITAXIAL MATERIALS", U.S. Pat. No. 7,769,135 issued Aug. 3, 2010 entitled "X-RAY DIFFRACTION WAFER MAPPING METHOD FOR RHOMBOHEDRAL SUPER-HETERO-EPITAXY", U.S. Pat. No. 8,226,767 issued Jul. 24, 2012 entitled "HYBRID BANDGAP ENGINEERING FOR SUPER-HETERO-EPITAXIAL SEMICONDUCTOR MATERIALS, AND PRODUCTS THEREOF", and U.S. Pat. No. 8,257,491 entitled "RHOMBOHEDRAL CUBIC SEMICONDUCTOR MATERIALS ON TRIGONAL SUBSTRATE WITH SINGLE CRYSTAL PROPERTIES AND DEVICES BASED ON SUCH MATERIALS", the entire contents of all of which are hereby incorporated by reference in their entireties.

The various embodiments provide an integrated multi-color light emitting device (e.g., a light emitting diode ("LED")) with a hybrid crystal structure and methods for making the same. Various embodiments may provide an integrated hybrid crystal Light Emitting Diode ("LED") display device that may emit red, green, and blue colors on a single wafer. The various embodiments may provide double-sided hetero crystal growth with hexagonal wurtzite III-Nitride compound semiconductor on one side of (0001) c-plane sapphire media and cubic zinc-blended III-V or II-VI compound semiconductor on the opposite side of c-plane sapphire media. In various embodiments the c-plane sapphire media may be a bulk single crystalline c-plane sapphire wafer, a thin free standing c-plane sapphire layer, or crack-and-bonded c-plane sapphire layer on any substrate. In various embodiments the bandgap energies and lattice constants of the compound semiconductor alloys may be changed by mixing different amounts of ingredients of the same group into the compound semiconductor. In various embodiments the bandgap energy and lattice constant may be engineered by changing the alloy composition within the cubic group IV, group III-V, and group II-VI semiconductors and within the hexagonal III-Nitrides.

The various embodiments may be an extension of the double sided hetero crystal growth with the hexagonal wurtzite III-Nitride compound semiconductor on one side of (0001) c-plane sapphire media and cubic zinc-blende III-V or II-VI compound semiconductor on the opposite side of c-plane sapphire media as shown in FIG. 1. FIG. 1 illustrates a double sided hetero crystal structure with the hexagonal wurtzite structure 102, such as a hexagonal wurtzite AlGaInN structure, on one side of the c-plane sapphire 101 and the cubic zinc blende III-V or II-VI compound semiconductor 103, such as AlGaInP or AlGaInAs, on the other side of the c-plane sapphire 101. In various embodiments, the c-plane sapphire 101 media may be a bulk single crystalline c-plane sapphire wafer, a thin free standing c-plane sapphire layer, or crack-and-bonded c-plane sapphire layer on any substrate.

Figure 2B:
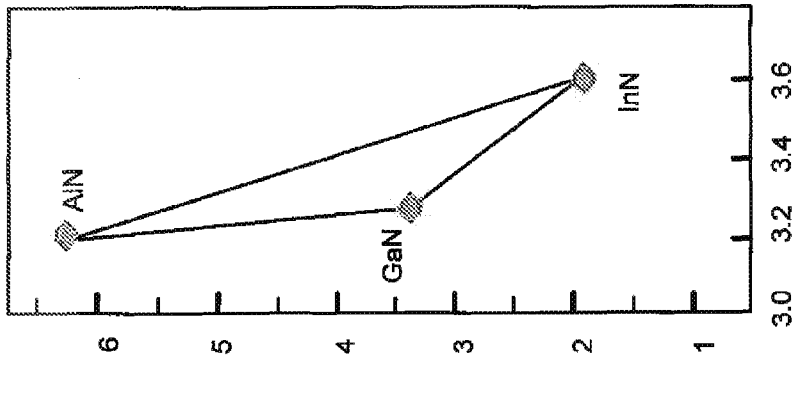
FIGS. 2A and 2B show the two distinct bandgap engineering diagrams in which the bandgap energies and the lattice constants of the compound semiconductor alloys may be changed by mixing different amounts of ingredients of the same group into the compound semiconductor.
Figure 2A:
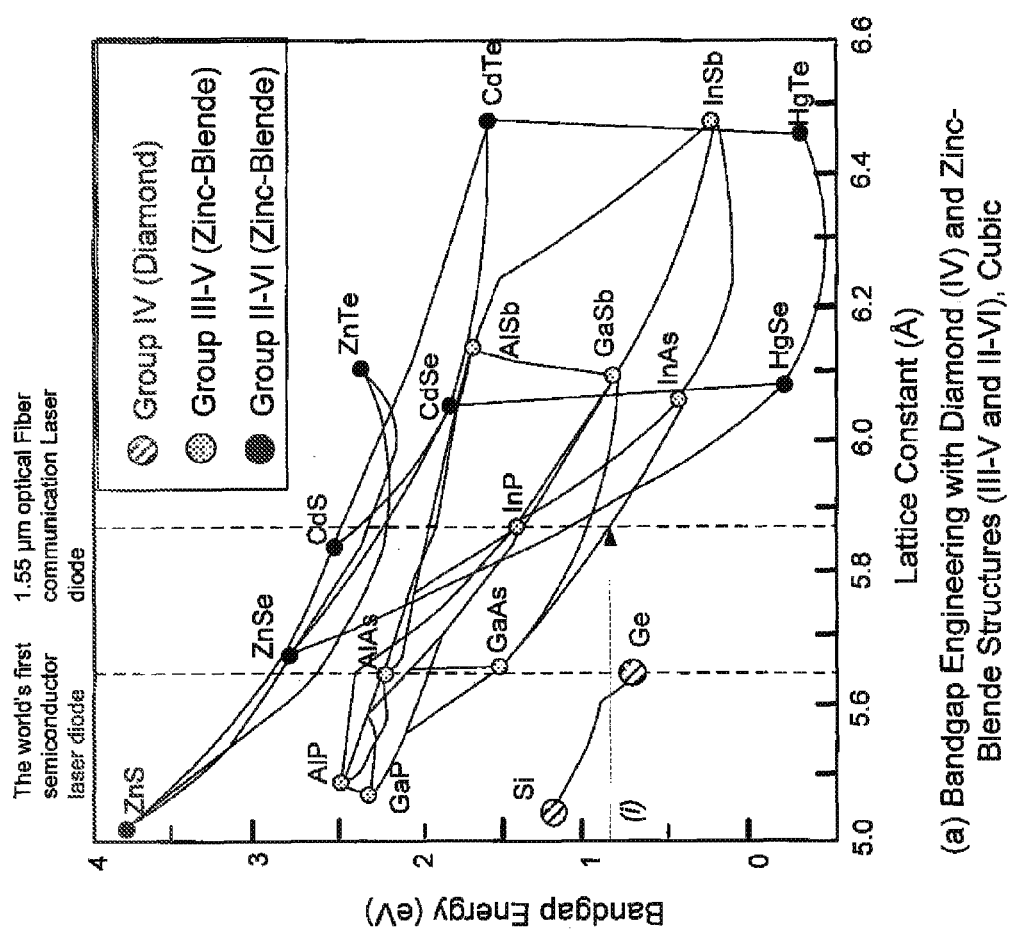

FIGS. 2A and 213 show the two distinct bandgap engineering diagrams in which the bandgap energies and the lattice constants of the compound semiconductor alloys may be changed by mixing different amounts of ingredients of the same group into the compound semiconductor. FIGS. 2A and 2B show the change of the bandgap energy and lattice constants of the compound semiconductor alloy mixed from each pure compound semiconductor. Four classes of materials are shown; cubic crystals include Group IV (Si, Ge, C), Group III-V (GaAs, AlAs, InAs, GaP, AlP, InP . . . ), and Group II-VI (ZnSe, CdS, HgTe . . . ). Hexagonal crystals may include Group III-Nitride (GaN, AlN, InN). For example, GaAs and InAs may be mixed to form $Ga_{1-x}In_xAs$ alloy that may match the lattice constant of InP and the bandgap energy of 1.55 micrometer wavelength as marked as (i) in FIG. 2A. The bandgap energy and lattice constant engineering by changing the alloy composition within the cubic group IV, group III-V, and group II-VI semiconductors and within the hexagonal III-Nitrides may be studied with a linear and quadratic approximation (bowing parameter).

Although some of the cubic II-VI compound semiconductors could reach high energy near 3.8 eV with ZnS, the defect and auto-compensation of p-type dopants in these materials may hinder the efficient blue light emission from II-VI LED devices. Cubic III-V compound semiconductor materials may have lower energy than 2.5 eV so that these materials may only emit IR, red, orange, yellow, and slightly yellowish green lights. III-V LEDs may not emit the blue, purple, and UV lights. On the other hand, the hexagonal III-nitride compound semiconductor may emit high energy lights such as green, blue, purple, and UV but may not emit the red and IR lights.

The various embodiments overcome the difficulties in the integration of these two different kinds of crystal structure materials through the use of rhombohedral hybrid epitaxy technology which may be guided by two new innovative X-ray diffraction characterization methods. The various embodiments may provide methods for integrating III-nitride layers on one side of the c-plane sapphire and [111] oriented rhombohedral III-V or II-VI compound semiconductor layers on the other side of the same sapphire wafer.

Figure 3:
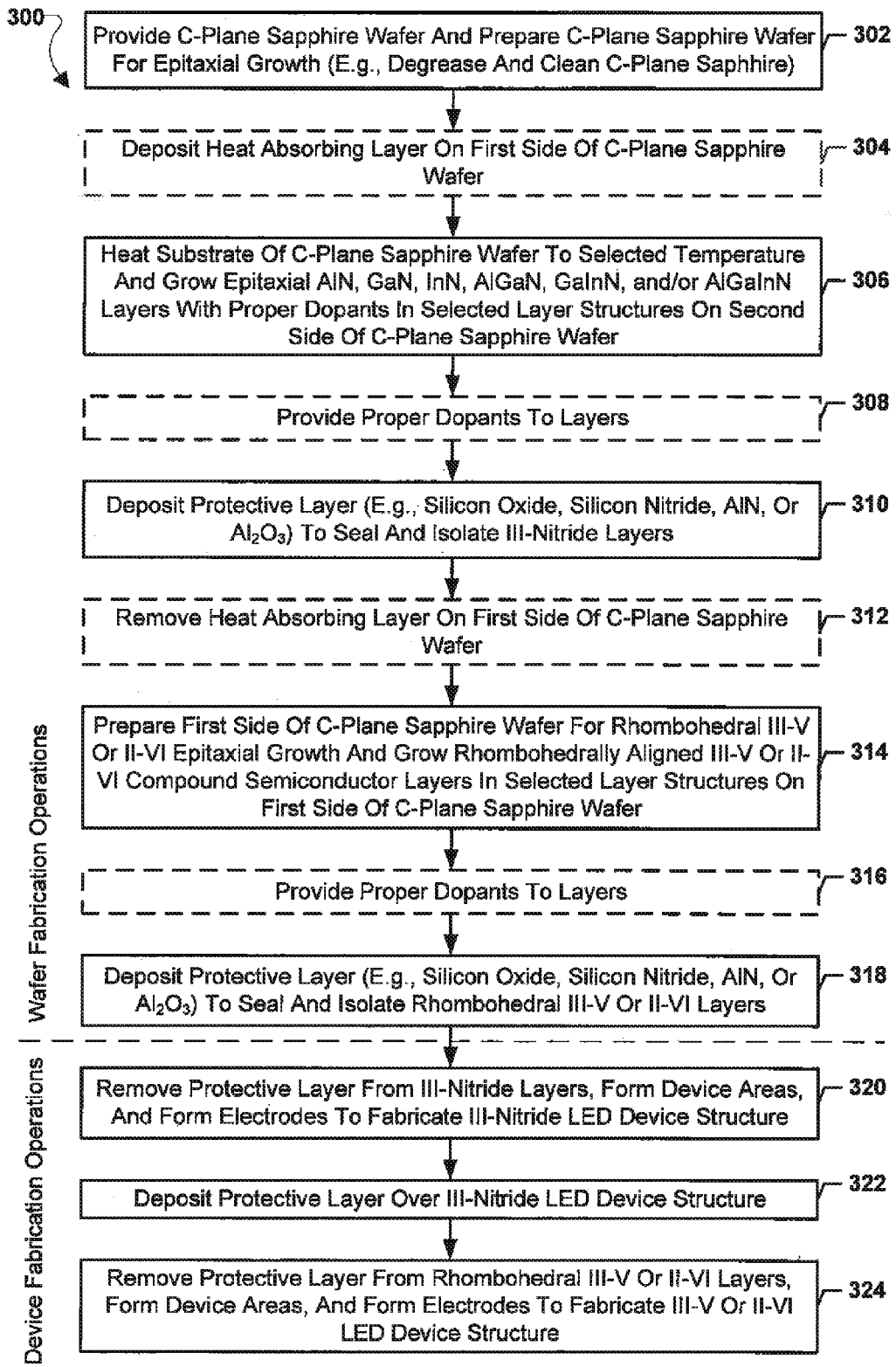
FIG. 3 is a process flow diagram illustrating an embodiment method for fabricating a double sided hybrid crystal III-V/II-VI and III-Nitride compound semiconductor wafer and integrated multi-color light emitting device.
Figure 4:
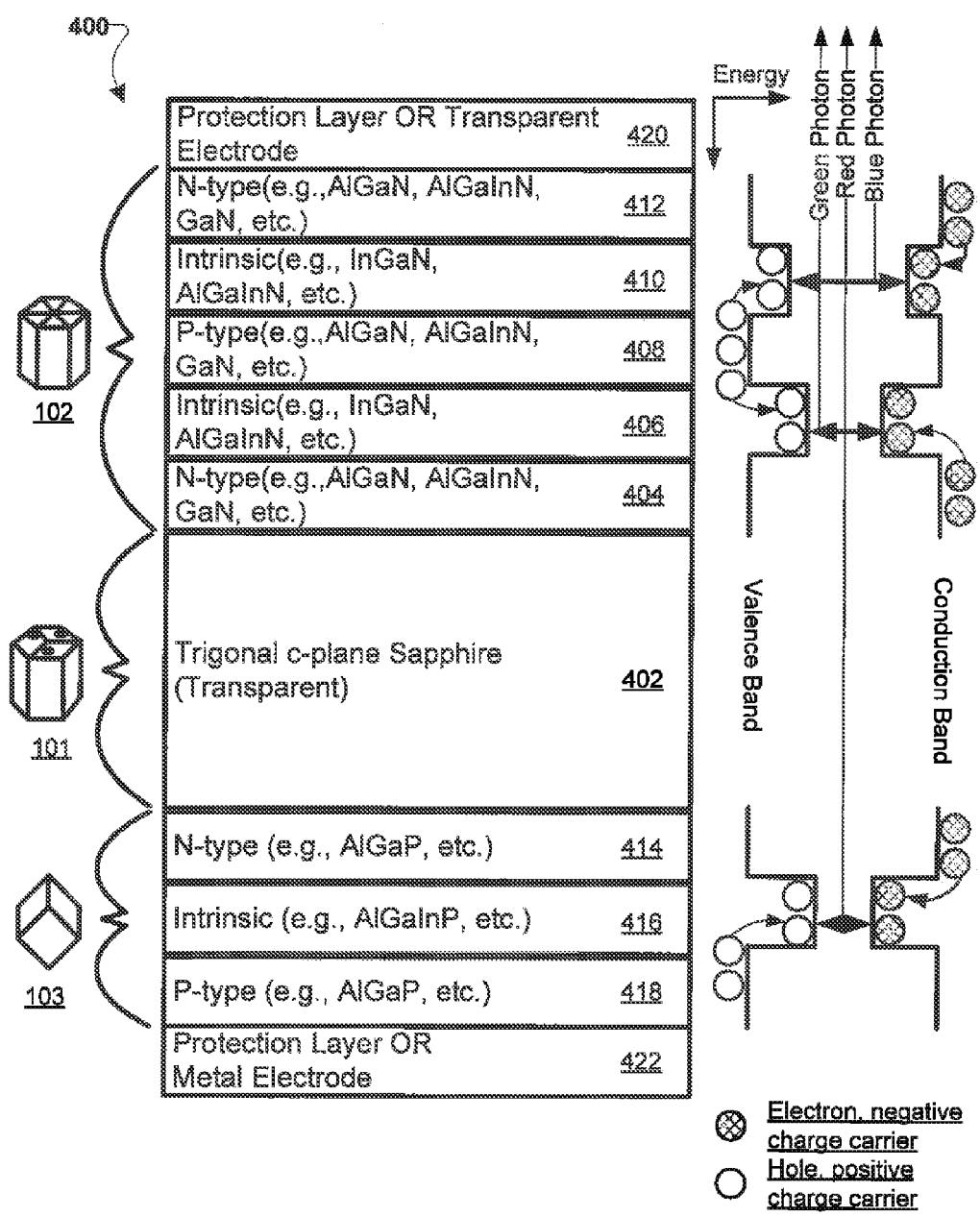
FIG. 4 is multi-layer diagram of a double sided hybrid crystal III-V/II-VI and III-Nitride compound semiconductor wafer according to an embodiment.
Figure 5:
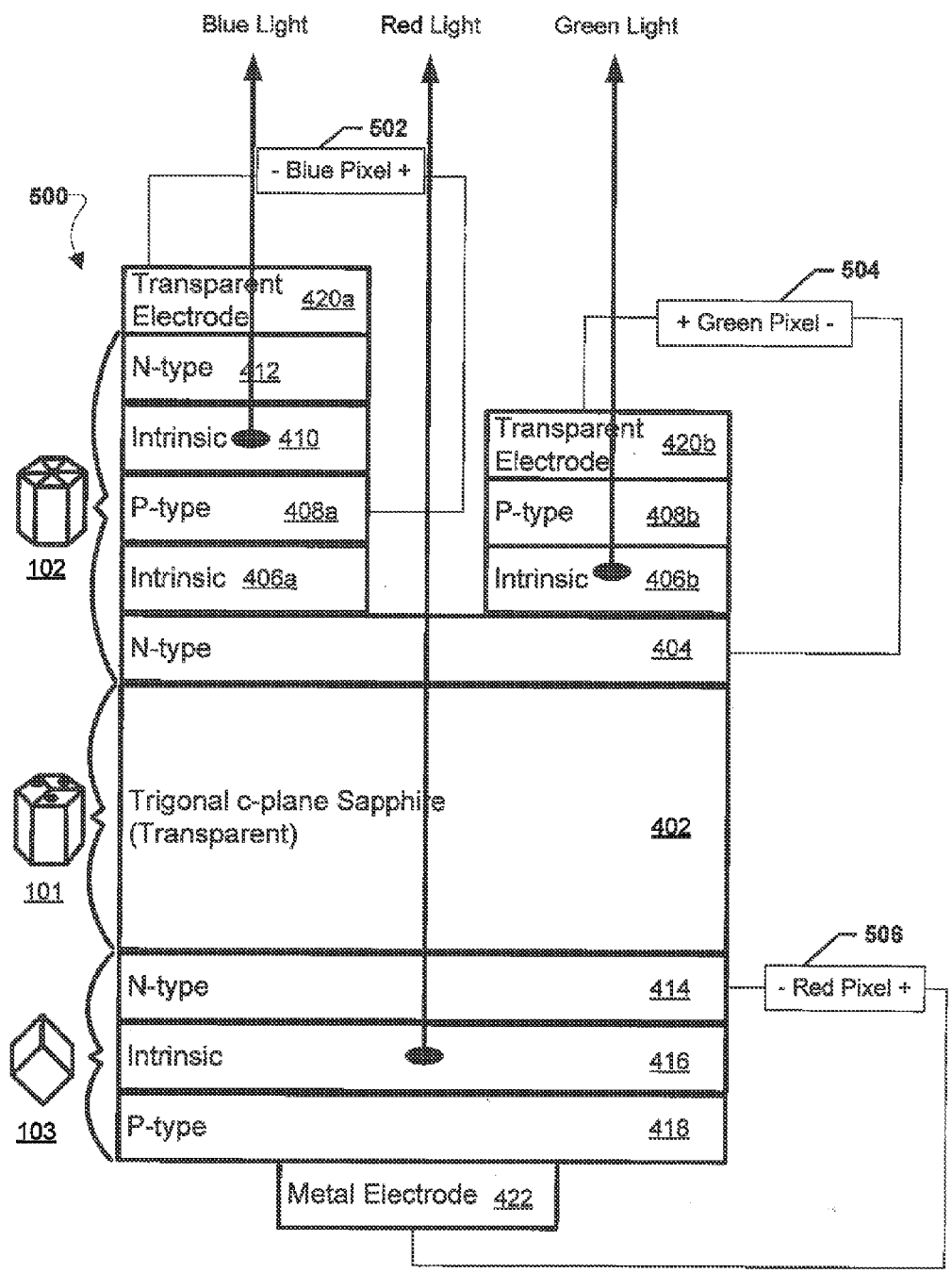
FIG. 5 is a fabricated device structure and circuit diagram for multi-color light emitting pixels according to an embodiment.
Figure 6:
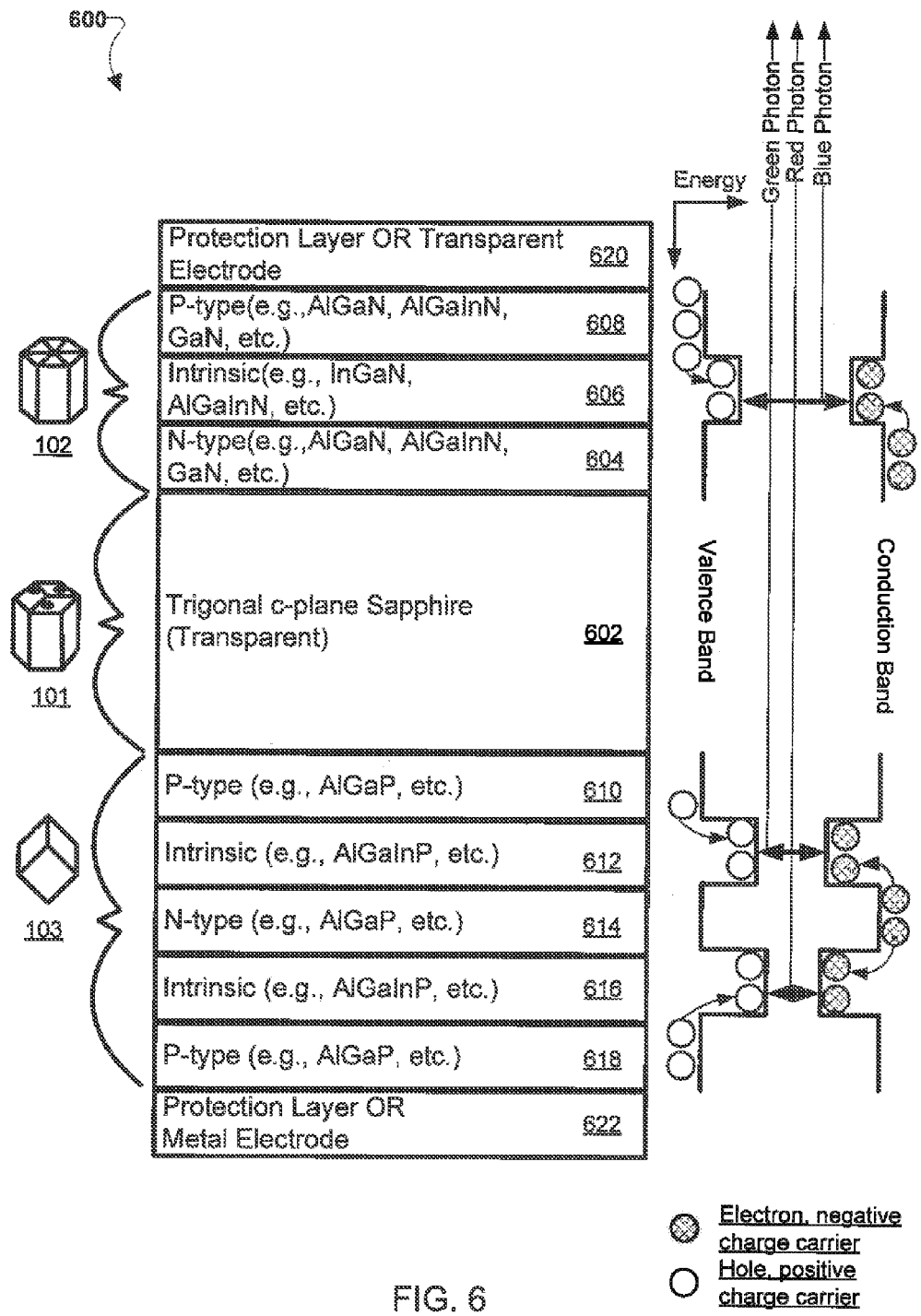
FIG. 6 is multi-layer diagram of a double sided hybrid crystal III-V/II-VI and HE-Nitride compound semiconductor wafer according to another embodiment.
Figure 7:
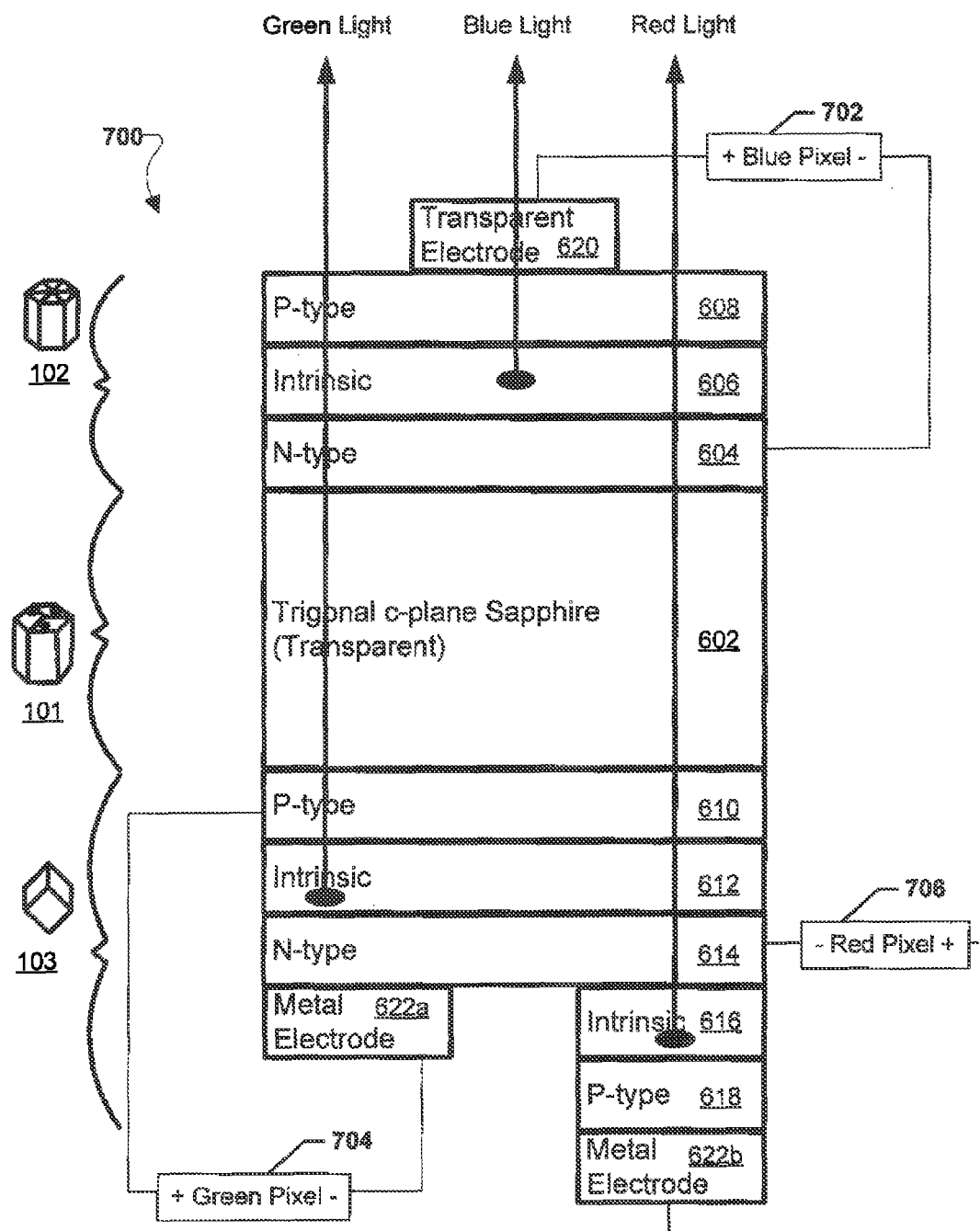
FIG. 7 is a fabricated device structure and circuit diagram for multi-color light emitting pixels according to another embodiment.

FIG. 3 is a process flow diagram illustrating an embodiment method 300 for fabricating a double sided hybrid crystal III-V/II-VI and III-Nitride compound semiconductor wafer and integrated multi-color light emitting device. Example double sided hybrid crystal III-V/II-VI and III-Nitride compound semiconductor wafers that may be fabricated by the operations of method 300 are illustrated in FIGS. 4 and 6 discussed further below, and example integrated multi-color light emitting devices (e.g., LEDs) that may be fabricated by the operations of method 300 are illustrated in FIGS. 5 and 7 discussed further below.

In block 302 a c-plane sapphire wafer may be provided and prepared for epitaxial growth. For example, the c-plane sapphire wafer may be degreased and cleaned in preparation for epitaxial growth.

In an optional embodiment, in optional block 304 a heat absorbing layer may be deposited on the first side of the c-plane sapphire wafer. As examples, the heat absorbing layer may be carbon or titanium. The heat absorbing layer may be optional if the sapphire wafer can be heated by direct contact with a clean heater element or direct e-beam heating. Alternatively, the heat absorbing layer may be required for high vacuum processes.

In block 306 the substrate of the c-plane sapphire wafer may be heated to a selected temperature and epitaxial layers of MN, GaN, InN, AlGaN, InGaN, and/or AlGaInN with proper dopants may be grown in selected layer structures on the second side of the c-plane sapphire wafer. The selected temperature may be a temperature and/or temperature range, such as a temperature and/or temperature range from about 800° C. to about 1200° C., a temperature and/or temperature range from about 700° C. to about 1000° C., and/or a temperature and/or temperature range from about 500° C. to about 900° C. The selected layer structures may be structures designed to fabricate efficient LED structures, such as various p-type layers, intrinsic layers, and n-type layers. As examples, one or more p-type layer may be grown comprised of AlGaN, InGaN, AlGaInN, MN, InN, or GaN doped with a p-type dopant, such as magnesium, one or more n-type layer may be grown comprised of AlGaN, InGaN, AlGaInN, MN, InN, or GaN doped with a n-type dopant, such as silicon, and one or more intrinsic layer may be grown comprised of AlGaN, InGaN, AlGaInN, MN, InN, or GaN. Intrinsic layers may not need any dopants. The selected layer structures may be various combinations of various numbers of n-type layers, p-type layers, and intrinsic layers extending from the second side of the c-plane sapphire wafer. As examples, extending from the second side of the c-plane sapphire wafer, the selected layer structures may be a series of n-i-p-i-n layers, a series of p-i-n-i-p layers, a series of n-i-p layers, a series of p-i-n layers, etc. In various embodiments, dopants for the various layers may be inserted during layer growth, ion implantation, or through a dopant diffusion drive-in process. In some embodiments, in optional block 308 proper and/or additional dopants may be provided to the layers.

Once all of the III-Nitride layers are fabricated, in block 310 a protective layer, such as silicon oxide, silicon nitride, MN, or $Al_2O_3$, may be deposited over the III-Nitride layers. The protective layer may seal and isolate the relatively delicate III-Nitride layers during the following III-V or II-VI semiconductor fabrication processes.

In an optional embodiment in which an optional heat absorbing layer was deposited on the first side of the c-plane sapphire wafer, in optional block 312 the heat absorbing layer on the first side of the c-plane sapphire wafer may be removed. For example, the heat absorbing layer may be removed by etching, such as wet etching, plasma etching, reactive ion etching, etc., or by chemical mechanical polishing ("CMP").

In block 314 the first side of the c-plane sapphire wafer may be prepared for rhombohedral III-V or II-VI epitaxy growth and rhombohedrally aligned III-V or II-VI compound semiconductor layers in selected layer structures may be gown on the first side of the c-plane sapphire wafer. The selected layer structures may be structures designed to fabricate efficient LED structures, such as various p-type layers, intrinsic layers, and n-type layers, for low energy light emitting devices, such as IR, red, orange, yellow, and green LEDs. As examples, one or more p-type layer(s) may be grown comprised of AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaIniPAs, AlPAs, InPAs, or GaPAs doped with a p-type dopant, such as magnesium, one or more n-type layer(s) may be grown comprised of AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGalInPAs, AlPAs, InPAs, or GaPAs doped with a ii-type dopant, such as silicon, and one or more intrinsic layer(s) may be grown comprised of AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs. Intrinsic layers may not need any dopants. The selected layer structures may be various combinations of various numbers of n-type layers, p-type layers, and/or intrinsic layers extending from the first side of the c-plane sapphire wafer. As examples, extending from the first side of the c-plane sapphire wafer, the selected layer structures may be a series of n-i-p layers, a series of p-i-n layers, a series of p-i-n-i-p layers, a series of n-i-p-i-n layers, a series of p-n layers, a series of n-p layers, etc. In various embodiments, dopants for the various layers may be inserted during layer growth, ion implantation, or through a dopant diffusion drive-in process. In some embodiments, in optional block 316 proper and/or additional dopants may be provided to the layers.

Once all the rhombohedral III-V or II-VI layers are fabricated, in block 318 a protective layer, such as silicon oxide, silicon nitride, MN, or $Al_2O_3$, may be deposited over the rhombohedral III-V or II-VI layers. The protective layer may seal and isolate the relatively delicate rhombohedral III-V or II-VI layers from the environment and during any further fabrication processes. The operations through block 318 may produce a double sided hybrid crystal III-V/II-VI and III-Nitride compound semiconductor wafer.

In order to make a full multi-wavelength light emitting device, each protective layer may have to be removed by a masked etching process to define one or more device areas on the wafer. In block 320 the protective layer may be removed from the III-Nitride layers, device areas may be formed on the III-Nitride layers, and electrodes may be formed on the HI-Nitride layers to fabricate a III-Nitride LED device structure on the second side of the c-plane sapphire wafer. The protective layer may be removed and the device areas defined by masked etching. Metal or transparent electrodes (e.g., Indium Tin Oxide (ITO) electrodes) may be formed to create a contact area to deliver positive (+) and negative (−) voltages and current. The protective layer over the III-V or II-VI layers may remain in place while the III-Nitride LED device structure is fabricated.

In block 322 a protective layer may be deposited over the III-Nitride LED device structure. In block 324 the protective layer may be removed from the rhombohedral III-V or II-VI layers, device areas may be formed on the rhombohedral III-V or II-VI layers, and electrodes may be formed on rhombohedral III-V or II-VI layers to fabricate a III-V or II-VI LED device structure on the first side of the c-plane sapphire wafer. The protective layer may be removed and the device areas defined by masked etching. Metal or transparent electrodes (e.g., ITO electrodes) may be formed to create a contact area to deliver positive (+) and negative (−) voltages and current.

By depositing, patterning, and removing materials through the standard lithography process, the integrated multi-wavelength light emitting devices may be formed. One pixel may be made of red, green, and blue LEDs from the double sides of the sapphire wafer, such as IR, R, G, B, or Red, Yellow, Green, and Blue. Multiple arrays of these pixels may be used to make a flat panel display or a projector panel.

In an embodiment, the operations of blocks 302-324 may be performed in a continuous process to produce an integrated multi-color light emitting device (e.g., an LED). In another embodiment, the operations of blocks 302-318 may be wafer fabrication operations performed independent of the operations of blocks 320-324 which may be device fabrication operations. For example, the wafer fabrication operations of blocks 302-318 may be performed during a wafer manufacturing process to produce a double sided hybrid crystal III-VIII-VI and III-Nitride compound semiconductor wafer that may be sold into the industrial commercial market. The double sided hybrid crystal III-V/II-VI and III-Nitride compound semiconductor wafer may be purchased by a customer and the operations of blocks 320-324 may be performed during a device manufacturing process to produce an integrated multi-color light emitting device (e.g., an LED).

In an embodiment, the sequence of operations of method 300 may be exchanged, such that the operations for rhombohedral III-V or II-VI layer formation may be performed first and the operations for III-Nitride layer formation may be performed second. However, performing III-Nitride layer formation first may be advantageous because the typical growth temperature for III-V or II-VI semiconductors may be lower than that of III-Nitride semiconductor growth.

FIG. 4 shows one type of an integrated multi wavelength light emitting device 400 made with a hybrid crystal according to an embodiment. The device 400 may be a double sided hybrid crystal III-V/II-VI and III-Nitride compound semiconductor wafer including a hexagonal structure 102 on one side of a c-plane sapphire 101 and a III-V or II-VI compound semiconductor 103 on an opposite side as described above with reference to FIG. 1. In this configuration, green and blue lights are generated in the III-Nitride semiconductor layer (comprising layers 404, 406, 408, 410, and 412), and the red light is generated in the rhombohedral III-V/II-VI semiconductor layer (comprising layers 414, 416, and 418). An ii-type layer 404 or 412 (e.g., n-type layers comprised of AlGaN, InGaN, AlGaInN, MN, InN, or GaN) provides electrons into the intrinsic or low-doped layer 406 or 410 (e.g., intrinsic or low-doped layers comprised of AlGaN, InGaN, AlGaInN, AlN, InN, or GaN) which has a lower conduction band when a voltage is applied. A p-type layer 408 (e.g., p-type layer comprised of AlGaN, InGaN, AlGaInN, AlN, InN, or GaN) in the middle provides holes into the intrinsic or low-doped layer 406 and/or 410 which has higher valence band when a voltage is applied. The two intrinsic or low doped layers 406 and 410 may have optimized contents of indium, gallium, and aluminum, to change their bandgap energies to that of blue and green photons, individually. For example, the alloy composition of the intrinsic or low doped layer 406 may be selected to bring the bandgap energy to that of the green photon (e.g., wavelength of 500-590 nanometers (nm)) and the alloy composition of the intrinsic or low doped layer 410 may be selected to bring the bandgap energy to that of the blue photon (e.g., wavelength of 400-500 nm). The accumulated electrons and holes in each intrinsic or low doped layer 406 and 410 easily recombine and emit the blue and green lights. A protection layer or transparent electrode 420 may be present on the outside surface of the III-Nitride semiconductor layer.

Although FIG. 4 shows a (Surface) n-i-p-i-n (Sapphire) structure of doping, other variation of layer structures can work. For example, (Surface) p-i-n-i-p (Sapphire) structure can work as well. Variations of these layers are also possible by inserting intrinsic or low doped AlN as a bather layer such as [1] (Surface) p-GaN i-GaInN n-GaN/AlN (as an electric barrier)/p-GaN/i-InGaN n-GaN/c-plane Sapphire (Substrate) or [2] (Surface) p-GaN/i-GaInN/n-GaN/AlN (as an electric barrier)/n-GaN/i-InGaN/p-GaN c-plane Sapphire (Substrate).

The rhombohedral III-V or II-VI LED structure (comprising layers 414, 416, and 418) may be made on the opposite side of sapphire 402. From the sapphire side, n-type layer 414 (e.g., a n-type layer comprising AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs) provides electrons into the intrinsic or low-doped layer 416 (e.g., an intrinsic or low-doped layer comprising AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs) while p-type layer 418 (e.g., a p-type layer comprising AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs) on the backside provides holes into the intrinsic, or low-doped layer 416. The accumulated electrons and holes recombine and emit the red lights. Similarly, variations of these structures also work such as n-i-p LED, p-i-n LED, or p-n LED, n-p LED structures. The intrinsic or low doped layer 416 may have optimized contents of indium, gallium, and aluminum, to change the bandgap energy to that of red photons. For example, the alloy composition of the intrinsic or low doped layer 416 may be selected to bring the bandgap energy to that of the red photon (e.g., wavelength of 590-700 nm). The thickness and alloy composition of the intrinsic or low-doped layers (e.g., intrinsic or low doped layers 406, 410, and 416) may be selected such that the narrowest relative bandgap energy may be at the intrinsic or low-doped layer (e.g., 416) emitting red photons and the widest relative bandgap energy may be at the intrinsic or low-doped layer (e.g., 410) emitting blue photons. If the thickness and alloy composition of intrinsic or low-doped layers (e.g., layers 406, 410, and 416) are critically controlled, a quantum well with discrete energy levels inside the layer may be formed. This may enhance the light emission efficiency. The variation of structure with a quantum well LED, multiple quantum well, graded indexed channeled LED, and stepped LED structure may also be formed in this hybrid crystal LED.

FIG. 5 shows the fabricated multi-wavelength integrated hybrid light emitting device 500 after all the post multilayer wafer processes including ITO deposit, lithography, etching, and metallization. For example, a Blue LED circuit and Green LED circuit may be formed by removing a middle portion of layers 412, 410, 408, and 406 to create two separate columns extending from the layer 404. One column of layers 412, 410, 408a, and 406a may be capped with a transparent electrode 420a to form the Blue LED. The other column may have the layers 412 and 410 removed leaving the layers 408b and 406b extending from the layer 404 which may be capped with a separate transparent electrode 420b to form the Green LED. The rhombohedral III-V or II-VI LED structure may not have material removed and may be capped with a metal electrode 422 to form the Red LED. Each circuit may drive the Red LED, Green LED, and Blue LED separately. The III-Nitride and sapphire may be transparent to the red light so that the red light from the backside of the wafer may propagate to the front surface of the wafer. Transparent electrodes such as ITO or thin Graphene are used on the front side electrodes 420a and 420b. Typical pixels 506, 504, and 502 may be made with the Red, Green, and Blue LEDs, respectively. More complex pixels may be formed with IR, R, G, and B. Different pixel color configurations may be made with selections from IR, Red, Orange, Yellow, Green, Blue, Purple, and UV. The array of the pixels may be used to build various devices, including a flat panel display, outdoor display, a projector panel, a scanner light source, or scientific optical instruments.

FIGS. 6 and 7 show another embodiment of an integrated multi-wavelength lighting device in which the green and red lights may be generated inside the rhombohedral III-V or II-VI layers. FIG. 6 shows an integrated multi wavelength light emitting device 600 made with a hybrid crystal according to an embodiment. The device 600 may be a double sided hybrid crystal III-V/II-VI and III-Nitride compound semiconductor wafer including a hexagonal structure 102 on one side of a c-plane sapphire 101 and a III-V or II-VI compound semiconductor 103 on an opposite side as described above with reference to FIG. 1. AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs may be used to make green, yellow, orange, and red colors. In the configuration illustrated in FIG. 6, only blue lights may be generated in the III-Nitride semiconductor layer (comprising layers 604, 606, and 608), and the green and red light may be generated in the rhombohedral III-V/II-VI semiconductor layer (comprising layers 610, 612, 614, 616, and 618). A protection layer or transparent electrode 620 may be present on the outside surface of the III-Nitride semiconductor layer and a protection layer or metal electrode 622 may be present on the outside surface of the rhombohedral III-V/II-VI semiconductor layer.

An n-type layer 604 (e.g., n-type layers comprised of AlGaN, InGaN, AlGaInN, MN, InN, or GaN) may provide electrons into the intrinsic or low-doped layer 606 (e.g., intrinsic or low-doped layers comprised of AlGaN, InGaN, AlGaInN, AlN, InN, or GaN) which has a lower conduction band when a voltage is applied. A p-type layer 608 (e.g., p-type layers comprised of AlGaN, InGaN, AlGaInN, AlN, InN, or GaN) in the middle provides holes into the intrinsic or low-doped layer 606 which has higher valence band when a voltage is applied. The accumulated electrons and holes in intrinsic or low-doped layer 606 easily recombine and emit the blue light.

The rhombohedral III-V or II-VI LED structure (comprising layers 610, 612, 614, 616, and 618) may be made on the opposite side of sapphire 602. From the sapphire side, p-type layer 610 (e.g., a p-type layer comprising AlGaP, InGaP, MAW, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs) provides holes into the intrinsic or low-doped layer 612 (e.g., an intrinsic or low doped layer comprising AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs) while from the lower surface side p-type layer 618 (e.g., a p-type layer comprising AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs) provides holes into the intrinsic or low-doped layer 616. The n-type layer 614 (e.g., a n-type layer comprising AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs) on the backside provides electrons into the intrinsic or low-doped layers 612 and 616. The accumulated electrons and holes recombine and emit the red and green lights. In this manner, in device 600 illustrated in FIG. 6, green and red lights are made by two different rhombohedral intrinsic or low-doped layers and blue light is made by hexagonal intrinsic or low-doped layer. The intrinsic, or low doped layer 616 may have optimized contents of indium, gallium, and aluminum, to change the bandgap energy to that of red photons, the intrinsic or low doped layer 612 may have optimized contents of indium, gallium, and aluminum, to change the bandgap energy to that of green photons, and the intrinsic or low doped layer 606 may have optimized contents of indium, gallium, and aluminum, to change the bandgap energy to that of blue photons. For example, the alloy composition of the intrinsic or low doped layer 616 may be selected to bring the bandgap energy to that of the red photon (e.g., wavelength of 580-700 nm), the alloy composition of the intrinsic or low doped layer 612 may be selected to bring the bandgap energy to that of the green photon (e.g., wavelength of 500-580 nm), and the alloy composition of the intrinsic or low doped layer 606 may be selected to bring the bandgap energy to that of the blue photon (e.g., wavelength of 400-500 nm). The thickness and alloy composition of the intrinsic or low-doped layers (e.g., intrinsic or low doped layers 606, 612, and 616) may be selected such that the narrowest relative bandgap energy may be at the intrinsic or low-doped layer (e.g., 616) emitting red photons and the widest relative bandgap energy may be at the intrinsic or low-doped layer (e.g., 606) emitting blue photons.

In device 700 of FIG. 7, while blue light is generated in the hexagonal intrinsic or low-doped layer (e.g., a i-AlGaInN layer), green and red lights are generated by two intrinsic or low-doped layers (e.g., i-AlGaInP layers) with different alloy compositions and thicknesses. FIG. 7 shows the fabricated multi-wavelength integrated hybrid light emitting device 700 after all the post multilayer wafer processes including ITO deposit, lithography, etching, and metallization. For example, a Blue LED circuit may be formed by capping the III-Nitride semiconductor layer with a transparent electrode 620, the III-Nitride semiconductor layer may not have material removed. The Red LED circuit and Green LED circuit may be formed by removing portions of layers 618 and 616 to create a column extending from the layer 614. The column of the remaining portions of layers 618 and 616 may be capped with a metal electrode 622b to form the Red LED. A metal electrode 622a separate from the column of layers 618 and 616 may be formed on the layer 614 which may form the Green LED. Each circuit may drive the Red LED, Green LED, and Blue LED separately. The III-Nitride and sapphire may be transparent to the red light and green light so that the red and green light from the backside of the wafer may propagate to the front surface of the wafer. Typical pixels 706, 704, and 702 may be made with the Red, Green, and Blue LEDs, respectively.

The working principles and device structure variations of devices 600 and 700 may be similar to those described above with reference to FIGS. 4 and 5.

In various embodiments, the wafer layer and device structures shown in the FIGS. 4, 5, 6 and 7 may work as integrated photon detectors as well. The typical photon detector has p-i-n structures. The photon detectors absorb light and generate electric current and voltage that may be an opposite operation to the light emitting device operations described above.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein; the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

This written description uses examples to disclose the invention, including the best mode, and also to enable any person skilled in the art to make and use the invention. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A double sided hybrid crystal and III-V/II-VI and III Nitride compound semiconductor device comprising:
   a trigonal sapphire layer;
   a hexagonal III-Nitride structure grown from a first side of the trigonal sapphire layer, wherein the hexagonal III-Nitride structure has a bandgap energy equal to that of a blue photon having a wavelength of 400-500 nm: and
   a rhombohedral III-V or II-VI structure grown from a second side of the trigonal sapphire layer, wherein the rhombohedral III-V or II-VI structure has a bandgap energy equal to that of a red photon having a wavelength of 580-700 nm.

2. The device of claim 1, wherein the trigonal sapphire layer is a (0001) c-plane sapphire layer.

3. The device of claim 2, wherein the (0001) c-plane sapphire layer is selected from the group consisting of a bulk single crystalline c-plane sapphire wafer, a thin free standing c-plane sapphire layer, and a crack-and-bonded c-plane sapphire layer on a substrate.

4. The device of claim 2, wherein the hexagonal III-Nitride structure comprises at least a first p-type layer and at least a first n-type layer both comprised of AlGaN, InGaN, AlGaInN, AlN, InN or GaN; and
   the rhombohedral III-V or II-VI structure comprises at least a second p-type layer and at least a second n-type layer comprised of AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs.

5. The device of claim. 4, wherein the hexagonal III-Nitride structure further comprises at least a first intrinsic layer comprised of AlGaN, InGaN, AlGaInN, AlN, InN, or GaN separating the first p-type layer and the first n-type layer; and
   the rhombohedral III-V or II-VI structure further comprises at least a second intrinsic layer comprised of AlGaP, InGaP, InAlP, AlGaInP, AlP, InP, GaP, AlGaAs, InGaAs, InAlAs, AlGaInAs, AlAs, InAs, GaAs, AlGaPAs, InGaPAs, InAlPAs, AlGaInPAs, AlPAs, InPAs, or GaPAs separating the second p-type layer and the second n-type layer.

6. The device of claim 5, wherein the first n-type layer separates the first intrinsic layer and the (0001) c-plane sapphire layer; and
   the second n-type layer separates the second intrinsic layer and the (0001) c-plane sapphire layer.

7. The device of claim 6, wherein the hexagonal III-Nitride structure further comprises a third intrinsic layer formed on a side of the first p-type layer extending away from the (0001) c-plane sapphire layer and a third n-type layer formed on a side of the third intrinsic layer extending away from the first p-type layer.

8. The device of claim 7, wherein:
   the first intrinsic layer comprises a first intrinsic layer first portion and a first intrinsic layer second portion;
   the first p-type layer comprises a first p-type layer first portion and a first p-type layer second portion;
   the first intrinsic layer first portion, the first p-type layer first portion, the third intrinsic layer, the third n-type layer, and a first transparent electrode comprise a first column extending from the first n-type layer away from the (0001) c-plane sapphire layer;
   the first intrinsic layer second portion, the first p-type layer second portion, and a second transparent electrode comprise a second column extending from the first n-type layer away from the (0001) c-plane sapphire layer and separate from the first column;
   the first transparent electrode, the third n-type layer, the third intrinsic layer, and the first p-type layer first portion comprise a blue LED circuit;
   the second transparent electrode, the first p-type layer second portion, the first intrinsic layer second portion, and the first n-type layer comprise a green LED circuit; and the second is-type layer, the second intrinsic layer, the second p-type layer, and a metal electrode comprise a red LED circuit.

9. The device of claim 5, wherein the first n-type layer separates the first intrinsic layer and the (0001) c-plane sapphire layer; and the second p-type layer separates the second intrinsic layer and the (0001) c-plane sapphire layer.

10. The device of claim 9, wherein the rhombohedral III-V or II-VI structure further comprises a third intrinsic layer formed on a side of the second n-type layer extending away from the (0001) c-plane sapphire layer and a third p-type layer formed on a side of the third intrinsic layer extending away from the second n-type layer.

11. The device of claim 10, wherein:

the third p-type layer, the third intrinsic layer, and a first metal electrode comprise a column extending from the second n-type layer away from the (0001) c-plane sapphire layer;

a second metal electrode formed on a side of the second n-type layer away from the (0001) c-plane sapphire layer and separate from the column;

the first metal electrode, the third p-type layer, the third intrinsic layer, and the second n-type layer comprise a red LED circuit;

the second metal electrode, the second n-type layer, the second intrinsic layer, and the second p-type layer comprise a green LEE) circuit; and the first n-type layer, the first intrinsic layer, the first p-type layer, and a transparent electrode comprise a blue LED circuit.

* * * * *